Dec. 12, 1967 G. E. SMITH 3,358,159

CIRCUIT FOR GATING SWEEP GENERATOR DIRECTLY FROM INPUT SIGNAL

Filed May 3, 1965

GEORGE E. SMITH
INVENTOR

BY
BUCKHORN, BLORE, KLARQUIST & SPARKMAN
ATTORNEYS

United States Patent Office 3,358,159

Patented Dec. 12, 1967

3,358,159

CIRCUIT FOR GATING SWEEP GENERATOR DIRECTLY FROM INPUT SIGNAL

George E. Smith, St. Louis, Mo., assignor to Tektronix, Inc., Beaverton, Oreg., a corporation of Oregon Filed May 3, 1965, Ser. No. 452,715
8 Claims. (Cl. 307—88.5)

ABSTRACT OF THE DISCLOSURE

A gating circuit for a sweep generator is described which is triggered directly by an input signal and not by an intermediate trigger pulse derived from such input signal. The gating circuit includes an arming switch circuit which is triggered by one portion of the input signal to produce an arming signal that enables a gating switch circuit to be triggered by a later portion of the same input signal which causes such gating circuit to gate the sweep generator "on." A holdoff multivibrator is employed to revert the switch circuits at the end of the leading edge of the sweep signal and to prevent them from being retriggered until the sweep signal returns to its quiescent value.

The subject matter of the present invention relates generally to triggered timing signal generators and in particular to a circuit for gating a ramp voltage signal generator directly by input signals which may be of different waveforms, without employing a trigger regenerator. Briefly, the triggered ramp generator of the present invention employs an arming switch circuit in addition to the usual gating switch circuit in order to "arm" such gating circuit by triggering the arming oscillator on an earlier portion of the same input signal that is employed to trigger such gating circuit. This may be accomplished by setting the triggering levels of the arming and gating switch circuits at two different amplitudes of the input signal so that the circuit operates like a Schmitt trigger circuit with a hysteresis characteristic in a similar manner to the circuit described in copending U.S. patent application Ser. No. 429,033 filed by Henry A. Zimmerman on Jan. 29, 1965.

The circuit of the present invention is especially useful when employed in the horizontal deflection system of a cathode ray oscilloscope to trigger the sweep generator of such oscilloscope. The present triggering circuit has several advantages over conventional sweep generator triggering circuits, including a simpler and less expensive construction. Thus, the present triggering circuit does not require a trigger regenerator circuit but triggers the gating oscillator of the sweep generator directly from the vertical input signal. This eliminates the time delay caused by the production of the regenerated trigger pulse which is characeristic of conventional triggering circuits, thereby reducing the total time delay between the application of the vertical input signal and the generation of the sweep signal. In addition, the present triggering circuit also prevents high frequency transient signals from being produced during the generation of the sweep signal, as are produced by the trigger regenerator of the conventional triggering circuit, which minimizes the problem of lead inductance in the power supply decoupling circuits.

The triggering circuit of the present invention reduces the time jitter of the output sweep signal with respect to the vertical input signal by reducing the sources of jitter and operating in a more jitter-free manner. This is accomplished by employing an arming switch circuit to arm the gating switch circuit for triggering, before the vertical input signal crosses the triggering level of such gating circuit. The jitter-free operation exists over a wide range of input signal frequencies as long as the width of the input signal is large compared to the rise time of the arming signal and in one preferred embodiment of the present invention a tunnel diode is employed as the arming switch circuit in order to produce an arming signal of extremely fast rise time.

It is therefore one object of the present invention to provide an improved triggered timing signal generator operating like a Schmitt trigger circuit to provide more stable triggering and less jitter.

Another object of the invention is to provide a gated ramp voltage signal generator of simple and inexpensive construction which is triggered directly from an input signal without employing a trigger regenerator circuit.

A further object of the invention is to provide an improved triggering circuit for a sweep generator which reduces the time delay between the application of an input signal and the generation of a sweep signal and also reduces the jitter of such sweep signal with respect to such input signal.

An additional object of the present invention is to provide an improved triggering circuit for a sweep generator which does not produce fast transient signals during the generation of a sweep signal to simplify power supply decoupling.

Still another object of the invention is to provide a triggered sweep generator which is armed by an early portion of an input signal which later triggers such sweep generator at a different level on such input signal.

Other objects and advantages of the present invention will be apparent from the following detailed description of a preferred embodiment thereof and from the attached drawings of which:

Figure 1:
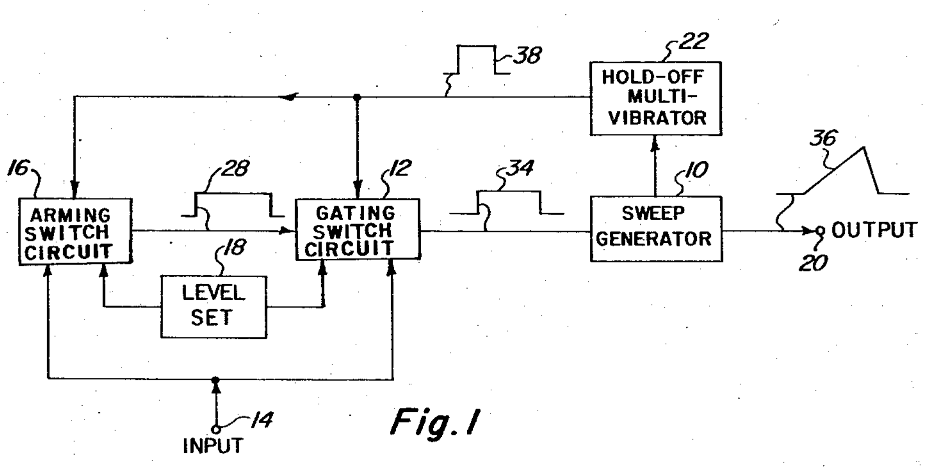
FIG. 1 is a block diagram of one embodiment of a triggered sweep generator circuit in accordance with the present invention.

As shown in FIG. 1, the circuit of the present invention includes a sweep generator 10 of the conventional type, such as a Miller integrator, which produces a linear ramp or sawtooth voltage output signal when such sweep generator is gated "on" and "off" by a gating switch circuit 12. The gating circuit 12 may be a bistable multivibrator connected to a signal input terminal 14 and to an arming switch circuit 16 which is also connected to such input terminal. The arming circuit may also be a bistable multivibrator similar to that of the gating circuit. The triggering levels of the arming circuit and the gating circuit are set at different values by a trigger level setting circuit 18 connected to both of such circuits. The triggering level of the arming circuit 16 is set to correspond with an earlier portion of the same vertical input signal that later crosses the triggering level of the gating circuit 12. As a result, the arming circuit is triggered first by the vertical input signal to cause such circuit to produce an arming signal which is applied to the gating circuit. This arming signal enables the gating circuit to be triggered by a later portion of the same vertical input signal. Thus, if the arming circuit 16 is not in a triggered state the gating circuit 12 cannot be triggered because it has not been "enabled" by an arming signal.

One output of the sweep generator 10 is connected to an output terminal 20 while another output of such sweep generator is connected to a hold-off multivibrator 22. The hold-off multivibrator 22 is a bistable multivibrator which is triggered when the sweep signal reaches its maximum amplitude and is reverted a short time after the return of the trailing edge of such sweep signal to its quiescent value. The output of the hold-off multivibrator 11 is connected to both the arming switch circuit 16 and the gating switch circuit 12 in order to revert both of such switch circuits and to prevent such switch circuits from being retriggered for a predetermined time.

Figure 2:
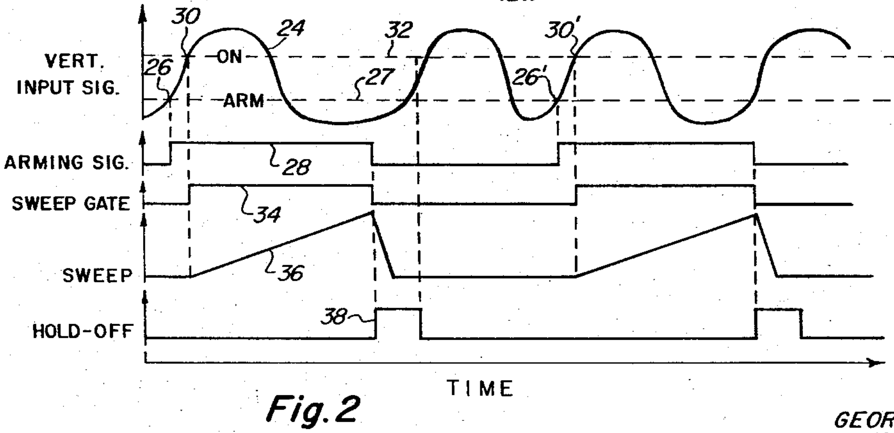
FIG. 2 is a diagram of the waveforms applied to and produced by the circuit of FIG. 1.

As shown in FIG. 2, a vertical input signal 24 applied to input terminal 14 will trigger the arming circuit 16 at a first point 26 where such input signal crosses a lower triggering level 27 to cause such circuit to produce a positive rectangular arming signal 28. The arming signal enables the gating circuit 12 to be triggered at a second point 30 on the input signal waveform corresponding to an upper triggering level 32. When the gating circuit is triggered, it produces a positive rectangular gating signal 34 which is applied to the sweep generator 10 starting the production of a ramp-shaped voltage sweep signal 36. When the leading edge of the sweep signal 36 reaches a predetermined maximum amplitude the hold-off multivibrator 22 is triggered to produce a positive rectangular hold-off signal 38. The leading edge of this hold-off signal reverts the arming circuit and the gating circuit to terminate the arming signal 28 and the gating signal 34.

When the gating signal 34 terminates, the trailing edge of the sweep signal is produced as it returns to its quiescent voltage level. The trailing edge of the sweep signal is "stretched" in a conventional manner as shown in U.S. patent 3,215,948 by transmitting such sweep signal through an emitter following amplifier having a capacitor load impedance, before it is applied to theh old-off multivibrator so that such hold-off multivibrator is reverted to terminate the hold-off signal 38 some time after the termination of the sweep signal. This completes one cycle of operation of the circuit of FIG. 1. However, it should be noted, as illustrated on the second vertical input signal 24 in FIG. 2, when the hold-off signal 38 terminates after the vertical input signal has passed the arming level 27, the gating circuit 12 will not be triggered when the input signal subsequently crosses the upper triggering level 32 because it has not yet received an arming signal. This prevents a gating pulse from being produced before the sweep signal has completely returned to its quiescent value, which could otherwise cause jitter in such sweep signal.

Figure 3:
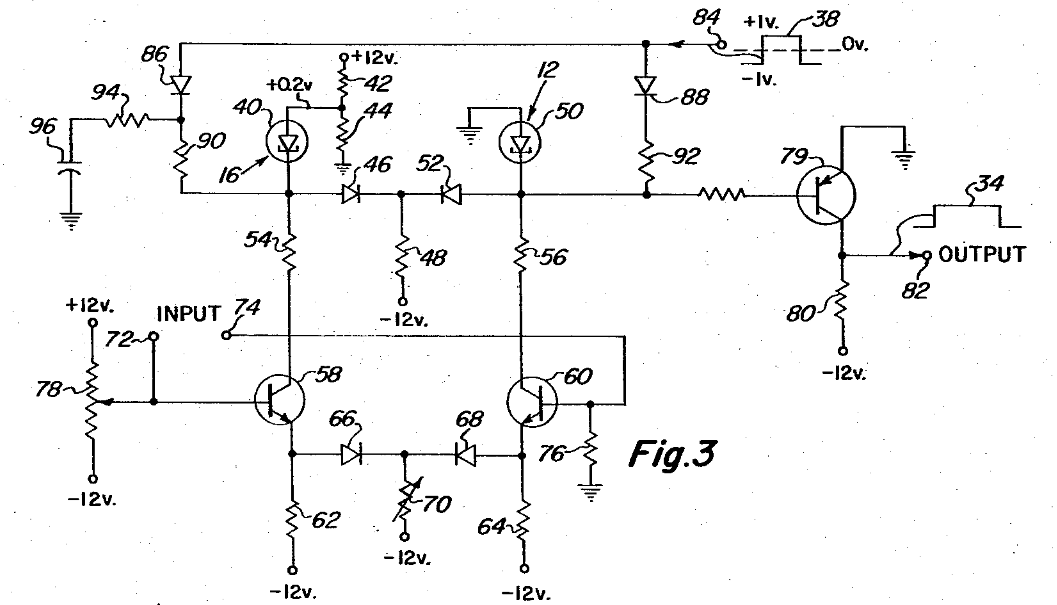
FIG. 3 is a schematic diagram of a preferred embodiment of a triggering circuit employed in the circuit of FIG. 1.

One embodiment of a triggering circuit which can be employed for the arming switch circuit 16 and the gating switch circuit 12 of FIG. 1 is shown in FIG. 3. In this embodiment a tunnel diode 40 connected as a bistable switch circuit quiescently biased in a low voltage stable state, is employed as the arming circuit 16. The anode of the tunnel diode is connected to a low impedance source of positive D.C. reference voltage of about 0.2 volt, which may be in the form of a voltage divider, including a pair of series-connected resistors 42 and 44 of appropriate value connected between +12 volts D.C. and ground. The cathode of tunnel diode 40 is connected through a switching diode 46 and a load resistor 48 to a source of negative D.C. supply voltage of about −12 volts. A second tunnel diode 50 also connected as a bistable switch circuit quiescently biased in a low voltage stable state, may be employed as the gating circuit 12 of FIG. 1. The anode of tunnel diode 50 is grounded and its cathode is connected through a switching diode 52 to the load resistor 48.

The cathodes of tunnel diodes 40 and 50 are each connected through a load resistor 54 and 56, respectively, to the collector of a transistor 58 and 60, respectively. Transistors 58 and 60 may each be of an NPN type, having their emitters connected through load resistors 62 and 64, respectively, to sources of negative D.C. supply voltage of −12 volts. The emitters of these transistors 58 and 60 are also connected through coupling diodes 66 and 68, respectively, to a source of negative D.C. supply voltage of −12 volts through a variable resistor 70. The bases of transistors 58 and 60 are connected to input terminals 72 and 74, respectively, so that such transistors form a differential amplifier whose output signal is produced between and applied to the cathodes of both tunnel diodes 40 and 50. It should be noted that the output signal of the differential amplifier provides two inputs for the arming tunnel diode 40 and the gating tunnel diode 50 which are 180 degrees out of phase so that such tunnel diodes may be triggered on different cycles of the input signal, rather than on the same cycle as shown in FIG. 2.

The base of transistor 60 is connected through a bias resistor 76 to ground, while the base of transistor 58 is connected to the movable contact of a potentiometer 78 whose end terminals are connected between sources of D.C. supply voltage of +12 volts and −12 volts in order to vary the bias voltage on transistor 58. The settings of potentiometer 78 and resistor 70 determine the amount of D.C. current flowing in the collector of transistor 58 which together with the D.C. current flowing through switching diode 46 and load resistor 48 sets the quiescent bias current of tunnel diode 40. Switching diode 46 is normally biased conducting while switching diode 52 is normally biased nonconducting due to the fact that +.2 volt is applied to the anode of tunnel diode 40 and the anode of tunnel diode 50 is grounded. This means that the anode of the diode 46 is at about 0 volts, while the anode of diode 52 is at about −.2 volt, due to the voltage drop across the tunnel diodes. Switching diode 46 conducts first, due to the fact that its anode is more positive than that of diode 52 and causes a voltage of about −.6 volt to be applied to the cathode of diode 52 due to the voltage drop across diode 46. Thus only .4 volt of forward bias is applied across switching diode 52 which is not sufficient to render such diode conducting. As a result, substantially all of the 4.5 milliamperes of D.C. bias current flowing through load resistor 48 is transmitted to tunnel diode 40 along with the collector current of transistor 58 of slightly less than 5.5 milliamps, which causes a quiescent D.C. bias current of slightly less than its 10 milliamperes peak current to flow through such tunnel diode. Therefore tunnel diode 40 is quiescently in condition to be triggered at a very flow through such tunnel diode. Therefore tunnel diode time the only bias current flowing through tunnel diode 50 is the approximately 5.5 milliamperes bias current supplied from the collector of transistor 60, so that such tunnel diode cannot be triggered by the input signal under these conditions.

When tunnel diode 40 is triggered, its cathode is driven to a negative voltage of about −.5 volt, thereby rendering diode 46 nonconducting and causing diode 52 to conduct. As a result, the 4.5 milliamperes bias current flowing in load resistor 48 is transmitted as an arming signal to tunnel diode 50 and added to the collector current of transistor 60 to bias the tunnel diode sufficiently near its peak current to be triggered by the vertical input signal. The triggering level of tunnel diode 50 is determined by the setting of variable resistor 70, which also controls the difference between triggering levels 27 and 32 so that it functions like a hysteresis adjustment.

The output signal of the tunnel diode 50 is transmitted from its cathode to the base of an inverter amplifier transistor 79. The inverter transistor may be a PNP type transistor having its emitter grounded and its collector connected to a source of negative D.C. supply voltage of −12 volts through a load resistor 80. The inverter transistor 79 reverses the phase of the gating signal and transmits it as a positive gating signal 34 to an output terminal 82 connected to the collector of such transistor.

The hold-off signal 38 is applied to an input terminal 84 connected to the anodes of a pair of coupling diodes 86 and 88 whose cathodes are connected, respectively, through coupling resistors 90 and 92 to the cathodes of tunnel diodes 40 and 50 respectively. The quiescent voltage of the hold-off signal applied to input terminal 84 is about −1 volt, which is sufficient to normally bias coupling diodes 86 and 88 both nonconducting. The hold-off signal increases to a maximum value of about +1 volt when the hold-off multivibrator is triggered, which renders coupling diodes 86 and 88 conducting, and robs current from the tunnel diodes 40 and 50 to prevent them from being retriggered until the hold-off signal terminates. The cathode of coupling diode 86 is connected to a high frequency bypass or "slow-down" circuit including a resistor 94 in series with a capacitor 96 having its other terminal grounded. The leading edge of the hold-off signal 38 is transmitted to ground through the slow-down circuit and "stretched" or delayed by the charging time of capacitor 96 so that tunnel diode 40 is reverted after tunnel diode 50. Similarly, the trailing edge of hold-off signal 38 is also transmitted to ground through the slow-down capacitor 96 causing the hold-off signal transmitted to tunnel diode 40 to terminate after the hold-off signal transmitted to tunnel diode 50 terminates. This means that the arming tunnel diode 40 cannot be retriggered until after the gating tunnel diode 50 has completely recovered to its quiescent state.

It will be obvious to those having ordinary skill in the art that many changes may be made in the above described preferred embodiment of the present invention without departing from the spirit of the invention. For example, a triggering circuit similar to that disclosed in the copending application Ser. No. 429,033 referred to above can be employed in place of the circuit of FIG. 3. Also the arming circuit 16 can be triggered on the negative slope of the vertical input signal 24 to enable the use of a somewhat longer rise time arming signal with the same frequency response. Therefore the scope of the present invention should only be determined by the following claims.

I claim:

1. A circuit for gating a signal generator comprising:
a signal generator which produces an output signal when a gating signal is applied to said signal generator;
a gating switch circuit having at least one stable state and connected to apply said gating signal to said signal generator when said gating circuit is triggered;
an arming switch circuit having two stable states and connected to apply an arming signal to said gating circuit when said arming circuit is triggered to enable said gating circuit to be triggered;
means for applying a trigger signal to both said arming circuit and said gating oscillator in order to trigger said arming circuit from a quiescent stable state to a triggered stable state on an earlier portion of the trigger signal and to trigger said gating circuit on a later portion of the same trigger signal after said arming signal has been produced; and
means for reverting said arming circuit to its quiescent stable state in response to the termination of said output signal.

2. A circuit for gating a signal generator comprising:
a signal generator which produces a ramp-shaped voltage output signal when a gating signal is applied to said signal generator;
a gating switch circuit having at least one stable state, connected to apply said gating signal to said signal generator when said gating circuit is triggered;
an arming switch circuit having at least one stable state, connected to apply an arming signal to said gating circuit when said arming circuit is triggered to enable said gating circuit to be triggered;
means for applying a trigger signal to both said arming circuit and said gating circuit in order to trigger said arming circuit on an earlier portion of the trigger signal and to trigger said gating circuit on a later portion of the same trigger siganl after said arming signal has been produced; and
hold-off means for preventing said arming circuit and said gating circuit from being triggered for a predetermined time after they are reverted.

3. A triggered signal generator circuit comprising:
a signal generator which produces a ramp-shaped voltage output signal when a gating signal is applied to said signal generator;
a bistable gating switch circuit connected to apply said gating signal to said signal generator when said gating circuit is triggered;
a bistable arming switch circuit connected to apply an arming signal to said gating circuit when said arming circuit is triggered to enable said gating circuit to be triggered;
means for applying a trigger signal to said arming circuit and to said gating circuit in order to trigger said arming circuit on an earlier portion of the trigger signal and to trigger said gating circuit on a later portion of the same trigger signal after said arming signal has been produced; and
hold-off means for transmitting hold-off signals from said signal generator to said gating circuit and said arming circuit to revert said gating circuit and said arming circuit to their quiescent stable states in response to the termination of the leading portion of said ramp signal and to prevent said arming circuit and said gating circuit from being triggered for a predetermined time after they are reverted, and for terminating the hold-off signal applied to said gating circuit before terminating the hold-off signal applied to the arming circuit and before said arming signal is applied to said gating circuit.

4. A triggered signal generator circuit comprising:
a signal generator which produces a ramp-shaped voltage output signal when a gating signal is applied to said signal generator;
a bistable gating switch circuit connected to apply said gating signal to said signal generator when said gating circuit is triggered;
a bistable arming switch circuit including a negative resistance semiconductor device connected to apply an arming signal to said gating circuit when said arming circuit is triggered to enable said gating circuit to be triggered;
means for applying a trigger signal to said arming circuit and to said gating circuit in order to trigger said arming circuit on an earlier portion of the trigger signal and to trigger said gating circuit on a later portion of the same trigger signal after said arming signal has been produced, said later portion having a different amplitude than said earlier portion; and
hold-off means for transmitting hold-off signals from said signal generator to said gating circuit and said arming circuit to revert said gating circuit and said arming circuit in response to the termination of said ramp signal and to prevent said arming circuit from being triggered for a predetermined time after it is reverted.

5. A triggered sweep generator circuit, comprising:
a sweep generator for producing ramp-shaped voltage sweep signals;
a gating switch circuit including a first negative resistance semiconductor device connected as a bistable circuit having its output connected to said sweep generator;
an arming switch circuit including a second negative resistance semiconductor device connected as a bistable circuit having its output connected to said gating circuit;
means for applying trigger signals to said gating circuit and said arming circuit to trigger said arming circuit and to subsequently trigger said gating circuit after it receives an enabling signal from the triggered arming circuit;
means connected between said sweep generator and both said gating circuit and said arming circuit to revert the switch circuits and prevent said switch circuits from being retriggered for a predetermined time after said sweep signal terminates;

means for setting the triggering levels for said first and second devices so that said arming circuit is triggered before said gating circuit.

6. A triggered sweep generator circuit, comprising:

a sweep generator for producing ramp-shaped voltage sweep signals;

a gating switch circuit including a first tunnel diode connected as a bistable circuit having its output connected to said sweep generator;

an arming switch circuit including a second tunnel diode connected as a bistable circuit having its output connected to said gating circuit;

hold-off means connected between said sweep generator and both said gating circuit and said arming circuit to prevent said switch circuit from being retriggered for a predetermined time after said sweep signal terminates;

a differential amplifier having one output connected to said first tunnel diode and another output connected to said second tunnel diode to supply bias current to both of said tunnel diodes and to apply input trigger signals to said tunnel diodes; and means for setting different triggering levels for said first and second tunnel diodes so that said arming circuit is triggered before said gating circuit.

7. A triggered sweep generator circuit, comprising:

a sweep generator for producing ramp-shaped voltage sweep signals;

a gating switch circuit including a first tunnel diode connected as a bistable circuit having its output connected to said sweep generator;

an arming switch circuit including a second tunnel diode connected as a bistable circuit having its output connected to said gating circuit;

a bistable hold-off multivibrator connected between said sweep generator and both said gating circuit and said arming circuit to revert both the switch circuits and to prevent said switch circuits from being retriggered for a predetermined time after said sweep signal terminates;

means for applying input trigger signals to said tunnel diodes;

means for setting different triggering levels for said first and second tunnel diodes so that said arming circuit is triggered before said gating circuit;

a pair of switching diodes each connected between a different one of said first and second tunnel diodes and a source of D.C. bias current; and means for quiescently biasing the switching diode connected to the second tunnel diode conducting and the other switching diode nonconducting, and for reversing the conductive conditions of such switching diodes in response to the triggering of said second tunnel diode in order to prevent the first tunnel diode from being triggered until after said second tunnel diode is triggered.

8. A horizontal deflection system for an oscilloscope, comprising:

a sweep generator for producing a ramp-shaped voltage sweep signal when said sweep generator receives a gating signal;

a gating switch circuit including a first tunnel diode connected as a bistable circuit having its output connected to said sweep generator to transmit a gating signal to said sweep generator when said first tunnel diode is triggered;

an arming switch circuit including a second tunnel diode connected as a bistable circuit having its output connected to said gating circuit to transmit an arming signal to said gating circuit when said second tunnel diode is triggered;

hold-off means including a pair of coupling diodes connected between said sweep generator and both said gating circuit and said arming circuit, for reverting both switch circuits and for preventing said switch circuits from being retriggered for a predetermined time after said sweep signal terminates;

an amplifier including a pair of transistors having their emitters connected together, their bases connected as inputs and their collectors connected as outputs with one output connected to said first tunnel diode and another output connected to said second tunnel diode to supply bias current to both of said tunnel diodes and to apply input signals to said tunnel diodes to trigger said tunnel diodes;

means for setting different triggering levels for said first and second tunnel diodes so that said second tunnel diode is triggered before said first tunnel diode and for varying said triggering levels;

a pair of switching diodes each connected between a different one of said first and second tunnel diodes and a source of D.C. bias current;

means for quiescently biasing the switching diode connected to the second tunnel diode conducting and the other switching diode nonconducting, and for reversing the conductive conditions of such switching diodes in response to the triggering of said second tunnel diode in order to prevent the first tunnel diode from being triggered until after said second tunnel diode is triggered; and means connected to the second tunnel diode to prevent the hold-off means from returning said second tunnel diode to its quiescent condition until after said first tunnel diode has been returned to its quiescent condition.

No references cited.

ARTHUR GAUSS, *Primary Examiner.*

J. ZAZWORSKY, *Assistant Examiner.*

UNITED STATES PATENT OFFICE

CERTIFICATE OF CORRECTION

Patent No. 3,358,159 December 12, 1967

George E. Smith

It is hereby certified that error appears in the above numbered patent requiring correction and that the said Letters Patent should read as corrected below.

Column 1, line 33, for "oscillator" read -- circuit --; line 50, for "oscillator" read -- switch circuit --; column 2, line 72, for "11" read -- 22 --; column 4, line 41, for "flow through such tunnel diode. Therefore tunnel diode" read -- low level on the vertical input signal. However at this --; column 5, line 47, for "oscillator" read -- circuit --; column 7, line 17, for "circuit" read -- circuits --; line 39, after "both" insert -- of --.

Signed and sealed this 14th day of January 1969.

(SEAL)

Attest:

Edward M. Fletcher, Jr.
Attesting Officer

EDWARD J. BRENNER
Commissioner of Patents